United States Patent
Ito (10) Patent No.: US 7,157,288 B2
(45) Date of Patent: Jan. 2, 2007

(54) METHOD OF PRODUCING FERROELECTRIC CAPACITOR

(75) Inventor: Toshio Ito, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 40 days.

(21) Appl. No.: 11/105,439

(22) Filed: Apr. 14, 2005

(65) Prior Publication Data

US 2006/0046315 A1 Mar. 2, 2006

(30) Foreign Application Priority Data

Aug. 24, 2004 (JP) .............................. 2004-243520

(51) Int. Cl.
*H01L 21/00* (2006.01)
(52) U.S. Cl. .................... 438/3; 257/E21.208
(58) Field of Classification Search .................. 438/3; 257/21.208
See application file for complete search history.

(56) References Cited

U.S. PATENT DOCUMENTS

| 5,532,182 A | * | 7/1996 | Woo | ........................... 438/254 |
|---|---|---|---|---|
| 6,423,592 B1 | | 7/2002 | Sun | |
| 6,495,413 B1 | | 12/2002 | Sun et al. | |
| 6,753,247 B1 | * | 6/2004 | Okoroanyanwu et al. | ... 438/623 |
| 2003/0143853 A1 | | 7/2003 | Celii et al. | |
| 2005/0101034 A1 | * | 5/2005 | Aggarwal et al. | ............. 438/3 |

* cited by examiner

*Primary Examiner*—Asok Kumar Sarkar
(74) *Attorney, Agent, or Firm*—Takeuchi&Kubotera, LLP (57) ABSTRACT

A method of producing a ferroelectric capacitor includes the steps of: preparing a semiconductor substrate; forming a first insulating layer on the semiconductor substrate; laminating sequentially a metal layer, a first conductive layer, a ferroelectric layer, and a second conductive layer on the first insulating layer to form a capacitor forming laminated layer; forming an etching mask forming layer with strontium tantalate or strontium niobate; forming a silicon oxide layer on the etching mask forming layer for covering a ferroelectric capacitor forming area; forming an etching mask through wet etching of the etching mask forming layer with the silicon oxide layer; and forming a lamination formed of a barrier metal, a lower electrode, a ferroelectric layer, and an upper electrode through dry etching of the capacitor forming laminated layer with the etching mask.

12 Claims, 7 Drawing Sheets

METHOD OF PRODUCING FERROELECTRIC CAPACITOR

BACKGROUND OF THE INVENTION AND RELATED ART STATEMENT

The present invention relates to a method of producing a ferroelectric capacitor.

A ferroelectric memory (FeRAM; Ferroelectric Random Access Memory) is has a structure in which a selective transistor is connected to a ferroelectric capacitor having a ferroelectric layer in series. In general, the ferroelectric capacitor has an electrode formed of noble metal such as platinum and iridium and a dielectric layer formed of a ferroelectric such as lead zirconate titanate and strontium bismuth tantalate. The ferroelectric capacitor has been commercially available as a small capacity memory up to 64 kb. The ferroelectric capacitor has advantages of fast data writing and random access, and has been expected to replace a conventional non-volatile memory. Accordingly, it has been desired to develop the ferroelectric capacitor with a large capacity.

Figure 7A:
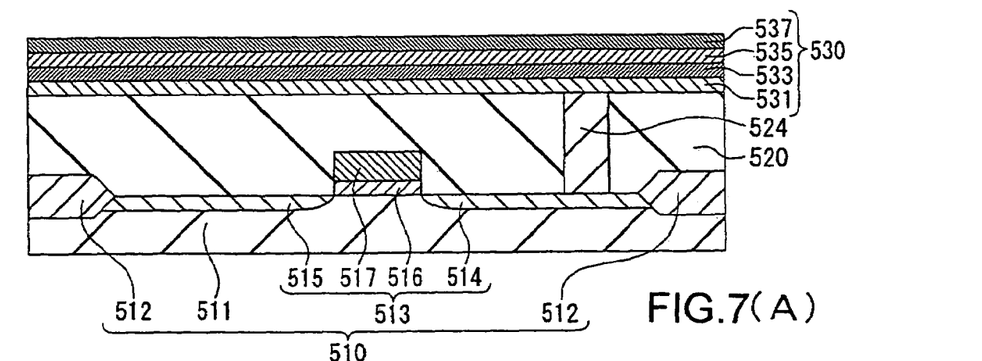
FIGS. 7(A) to 7(C) are explanatory views showing a conventional method of producing a ferroelectric capacitor.
Figure 7B:
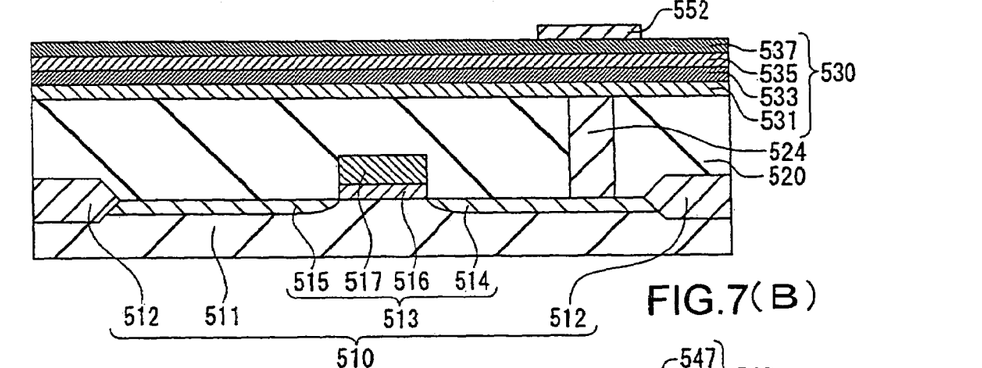
Figure 7C:
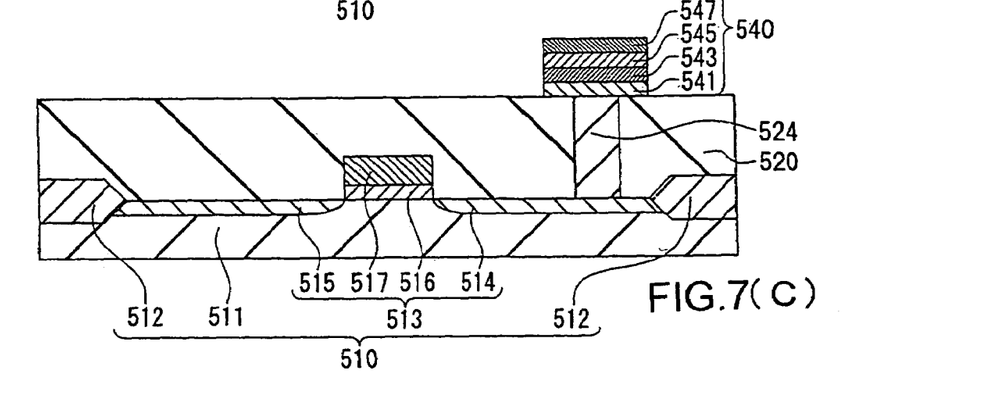

A method of producing the ferroelectric memory, in particular the ferroelectric capacitor, will be explained with reference to FIGS. 7(A) to 7(C) (refer to Patent References 1 and 2). FIGS. 7(A) to 7(C) are explanatory views showing a conventional method of producing the ferroelectric capacitor.

First, a capacitor forming laminated layer 530 is formed on a semiconductor substrate 510. The capacitor forming laminated layer 530 is formed of an interlayer insulating layer 320, a metal layer 531, a first conductive layer 533, a ferroelectric layer 535, and a second conductive layer 537, sequentially laminated, respectively. The semiconductor substrate 510 is provided with a silicon substrate 511 and an MOSFET 513 formed in an area defined by element separation insulating layers 512. The MOSFET 513 is formed of a drain area 514, a source area 515, a gate insulating layer 516, and a gate electrode 517. The interlayer insulating layer 520 is formed of an oxide layer, and is provided with a conductive plug 524.

In the next step, as shown in FIG. 7(B), a hard mask 552 is formed on the capacitor forming laminated layer 530 for covering an area for forming a ferroelectric capacitor with photo-lithography and dry etching. The hard mask 552 may be formed of SrRuO$_3$ (SRO; refer to Patent Reference 1) or lead zirconate titanate (PZT; refer to Patent Reference 2).

In the next step, as shown in FIG. 7(C), the capacitor forming laminated layer 530 is shaped in a lamination 540 with a desired shape through dry etching using the hard mask 552. After the dry etching, a remaining portion of the metal layer 531 becomes a barrier metal 541; a remaining portion of the first conductive layer 533 becomes a lower electrode 543; a remaining portion of the ferroelectric layer 535 becomes a ferroelectric layer 545; and a remaining portion of the second conductive layer 537 becomes an upper electrode 547. The lamination 540 becomes the ferroelectric capacitor, and a memory cell of the ferroelectric memory is formed of the second conductive layer 537 and the lamination (the ferroelectric capacitor) 540.

Patent Reference 1; U.S. Pat. No. 6,495,413
Patent Reference 2; U.S. Pat. No. 6,423,592

In the conventional method of producing a ferroelectric capacitor, it is difficult to etch an electrode material of the lower electrode and the upper electrode, and the ferroelectric layer through the dry etching. Accordingly, in a case that the ferroelectric layer has a large thickness, or it is difficult to provide a large selectivity relative to a resist, a hard mask formed of silicon nitride or titanium nitride is used. Even when such a hard mask is used, it is still necessary to increase a thickness of the hard mask. When the hard mask has a large thickness, a dimension conversion difference increases. The dimension conversion difference has a larger influence as a size of a pattern decreases, thereby making it difficult to obtain a fine pattern necessary for producing a ferroelectric capacitor with high integration density.

Further, when a fine pattern is formed, since the size of a contact hole cannot be reduced under a design standard, an areal ratio of the contact hole relative to a capacitor area may become large. In this case, when the contact hole is opened through dry etching, there is a risk of damaging the ferroelectric capacitor. Such damage includes physical damage due to an electric stress such as charging and chemical damage due to a reducing gas passing through the upper electrode.

In view of the problems described above, an object of the present invention is to provide a method of producing a ferroelectric capacitor with a fine pattern and a small dimension conversion difference. Another object of the present invention is to provide a method of reducing damage generated at an opening of a contact hole formed on the ferroelectric capacitor.

Further objects and advantages of the invention will be apparent from the following description of the invention.

SUMMARY OF THE INVENTION

In order to attain the objects described above, according to an aspect of the present invention, a method of producing a ferroelectric capacitor includes the steps of: preparing a semiconductor substrate; forming a first insulating layer on the semiconductor substrate; laminating sequentially a metal layer, a first conductive layer, a ferroelectric layer, and a second conductive layer on the first insulating layer to form a capacitor forming laminated layer; forming an etching mask forming layer with strontium tantalate or strontium niobate; forming a silicon oxide layer on the etching mask forming layer for covering a ferroelectric capacitor forming area; forming an etching mask through wet etching of the etching mask forming layer with the silicon oxide layer; and forming a lamination formed of a barrier metal, a lower electrode, a ferroelectric layer, and an upper electrode through dry etching of the capacitor forming laminated layer with the etching mask.

In the aspect of the present invention, the layer, which is difficult to etch through dry etching, is etched through wet etching to form the etching mask for dry etching. Accordingly, it is possible to reduce a thickness of the etching mask and provide a fine pattern.

DETAILED DESCRIPTION OF PREFERRED EMBODIMENTS

Hereunder, embodiments of the present invention will be explained with reference to the accompanying drawings. A configuration and arrangement of an embodiment are schematically presented for explaining the invention. The embodiments will be explained with configurations and numerical conditions as preferred examples, and the invention is not limited thereto.

With reference to FIGS. 1(A)–1(C) to 3(A)–3(C), a method of producing a ferroelectric capacitor according to a first embodiment of the present invention will be explained. FIGS. 1(A)–1(C) to 3(A)–3(C) are explanatory sectional views showing the method of producing a ferroelectric capacitor according to the first embodiment.

In the method, first, a semiconductor substrate 10 is prepared. The semiconductor substrate 10 is provided with a silicon substrate 11 and an MOSFET (metal oxide semiconductor field effect transistor) 13 formed in advance in an area on the silicon substrate 11 defined by an element separation insulating layer 12. In the embodiment, the MOSFET 13 is an N-type MOSFET (NMOS), and the silicon substrate 11 is a P-type substrate. A drain area 14 containing a high concentration of N-type impurity ($N^+$-type) and a source area 15 are formed on a surface of the silicon substrate 11 with a predetermined distance in between. A gate area 17 is formed on the silicon substrate 11 through a gate insulating layer 16 in an area between the drain area 14 and the source area 15 (see FIG. 1(A)). The area of the silicon substrate 11 between the drain area 14 and the source area 15 becomes a channel forming area, in which a channel (conductive path) connecting between a drain and a source is formed when the NMOS is operated. A process of manufacturing the MOSFET has been well known, and a description thereof is omitted.

Next, a first interlayer insulating layer 20 is deposited on the semiconductor substrate 10. The first interlayer insulating layer 20 is formed as a silicon oxide layer with, for example, a CVD (chemical vapor deposition) method. The first interlayer insulating layer 20 is etched with a photolithography, so that a contact hole is formed above the drain area 14 or the source area 15 of the MOSFET 13 (in the embodiment, above the drain area 14). The contact hole is filled with tungsten with the CVD method to form a conductive plug 24. Then, a surface of the first interlayer insulating layer 20 is flattened with a CMP (chemical mechanical polishing) method (see FIG. 1(B)).

Figure 1A:
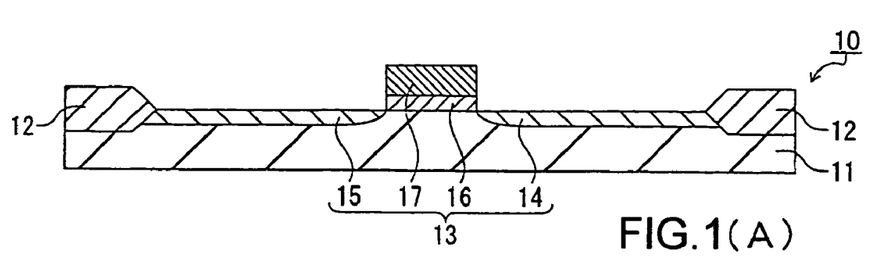
FIGS. 1(A) to 1(C) are explanatory views showing a method of producing a ferroelectric capacitor (No. 1) according to a first embodiment of the present invention.
Figure 1B:
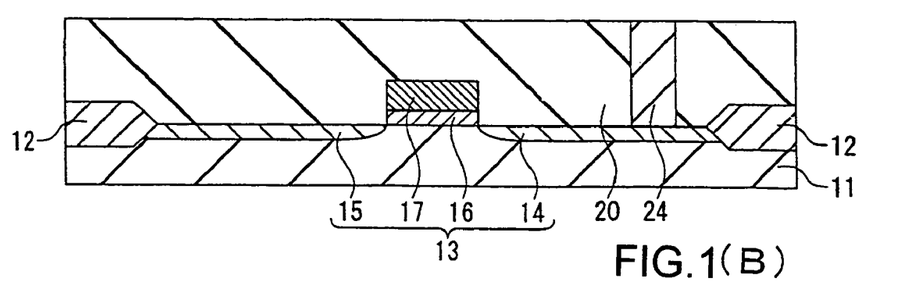
Figure 1C:
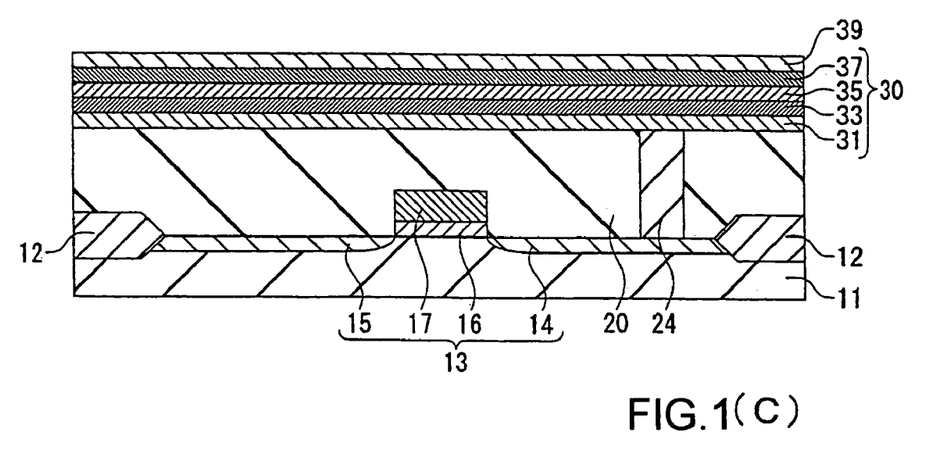

In the next step, a metal layer 31, a first conductive layer 33, a ferroelectric layer 35, and a second conductive layer 37 are sequentially laminated on the first insulating layer 20 to form a capacitor forming laminated layer 30. The metal layer 31 is formed of a material selected from one of titanium nitride, aluminum nitride, or tantalum nitride. The metal layer 31 is formed on the first interlayer insulating layer 20 with a sputtering method. The first conductive layer 33 is formed of a material selected from one of platinum, iridium, ruthenium, or iridium oxide; or is formed as a laminated layer formed of more than two of the materials described above. The first conductive layer 33 is formed on the metal layer 31 with the sputtering method.

The ferroelectric layer 35 is formed of a material selected from lead zirconate titanate, strontium bismuth tantalate, bismuth titanate, or bismuth lanthanum titanate according to a purpose and specification. Similar to the first conductive layer 33, the second conductive layer 37 is formed of a material selected from one of platinum, iridium, ruthenium, or iridium oxide; or is formed as a laminated layer formed of more than two of the materials described above.

An etching mask forming layer 39 formed of strontium tantalate or strontium niobate is then formed on the second conductive layer 37 of the capacitor forming laminated layer 30 with the CVD method (see FIG. 1(C)).

In the embodiment, the metal layer 31 is formed of a titanium nitride layer with a thickness of 25 nm. The first conductive layer 33 is a laminated layer formed of a platinum layer with a thickness of 50 nm, an iridium oxide layer with a thickness of 100 nm, and an iridium layer with a thickness of 100 nm. The ferroelectric layer 35 is formed of a strontium bismuth tantalate layer with a thickness of 120 nm. The second conductive layer 37 is formed of a platinum layer with a thickness of 100 nm. The etching mask forming layer 39 is formed of a strontium tantalate layer with a thickness of 100 nm.

Figure 2A:
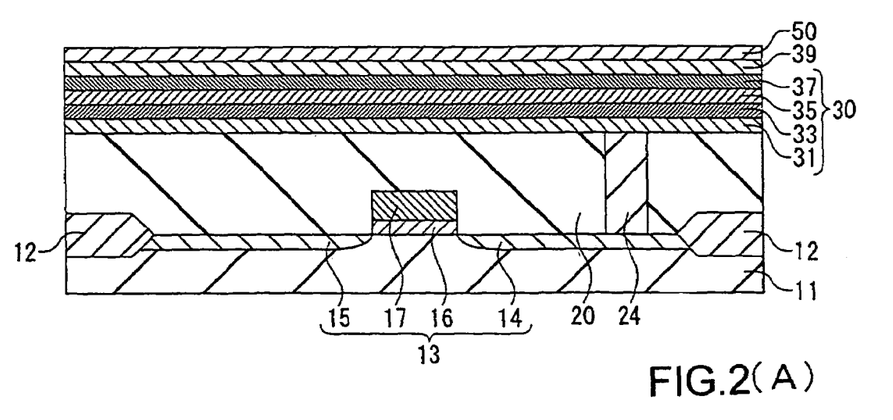
FIGS. 2(A) and 2(B) are explanatory views showing a method of producing a ferroelectric capacitor (No. 2) according to the first embodiment of the present invention.
Figure 2B:
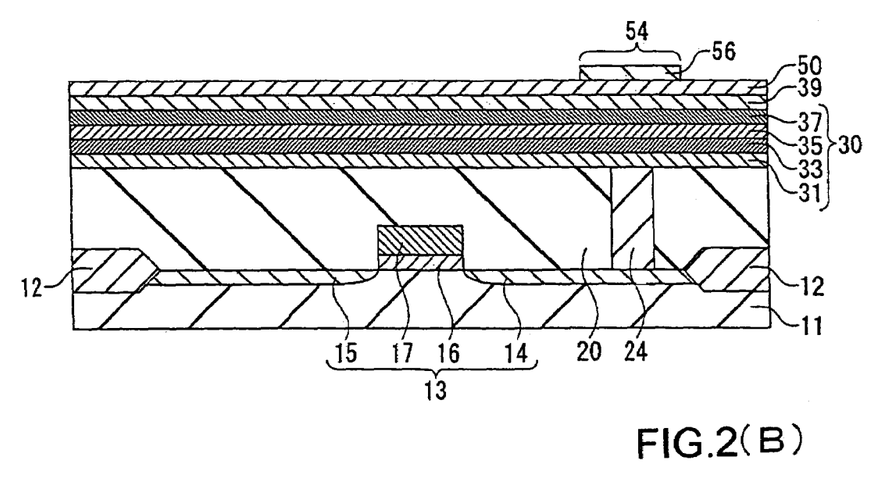

In the next step, a silicon oxide layer 50 is deposited on the etching mask forming layer 39 (see FIG. 2(A)). Then, a resist formed of an organic resin is applied on the silicon oxide layer 50 to form a photo-resist layer (not shown). A pattern is formed with a known lithography, so that a photo-resist pattern 56 is formed above the conductive plug 24 of the silicon oxide layer 50 in an area covering a capacitor forming area 54 (see FIG. 2(B)).

In the next step, a portion of the silicon oxide layer 50 without the photo-resist pattern 56 is removed through reactive ion etching (RIE) to form a silicon oxide layer mask 52. Then, the photo-resist pattern 56 is removed, so that the silicon oxide layer mask 52 remains on a ferroelectric capacitor forming area 54 of the etching mask forming layer 39 (see FIG. 3(A)).

Figure 3A:
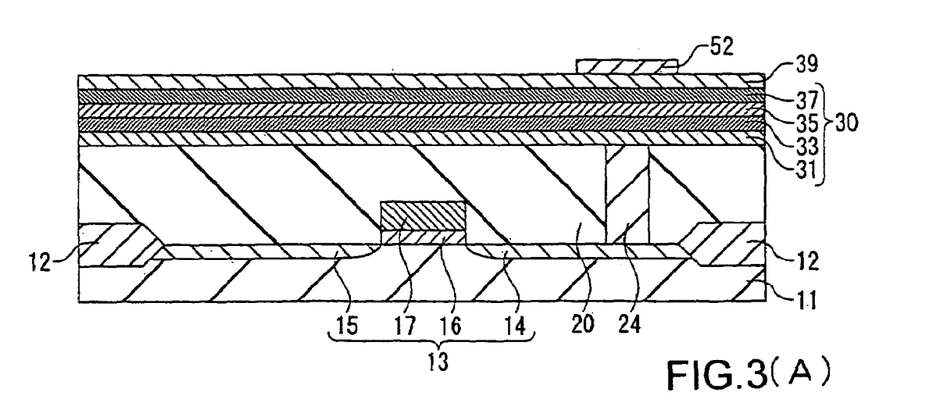
FIGS. 3(A) to 3(C) are explanatory views showing a method of producing a ferroelectric capacitor (No. 3) according to the first embodiment of the present invention.
Figure 3B:
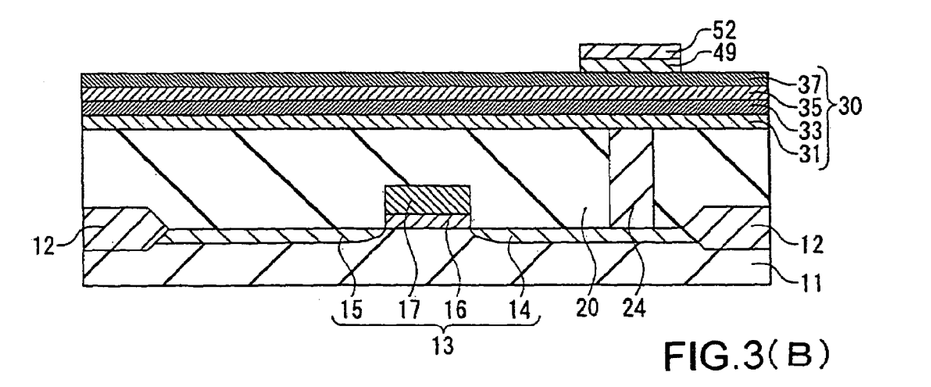

In the next step, an etching mask 49 formed of strontium tantalate is formed through the wet etching with the silicon oxide layer mask 52 (see FIG. 3(B)). A mixture of nitric acid, fluorinated acid, and acetic acid is used as an etchant of the wet etching. It is difficult to etch strontium tantalate through the dry etching. However, strontium tantalate is soluble in a mixture of nitric acid, fluorinated acid, and acetic acid for the following reason.

Strontium tantalate $SrTa_2O_6$ is a composite oxide crystal of tantalum oxide $Ta_2O_5$ and strontium oxide SrO. Tantalum oxide $Ta_2O_5$ is converted to water-soluble tantalate hexafluoride $HTaF_6$ through the following reaction.

Strontium oxide SrO reacts with water to yield strontium hydroxide $Sr(OH)_2$ through the following reaction.

Strontium hydroxide $Sr(OH)_2$ is highly soluble in acid.

It is preferred that the mixture of nitric acid, fluorinated acid, and acetic acid contains 2 to 95 weight % of 60% nitric acid aqueous solution, 5 to 98 weight % of 50% fluorinated acid aqueous solution, and 5 to 70 weight % of glacial acetic acid. The etchant may contain only nitric acid and fluorinated acid without glacial acetic acid. It is preferable to use glacial acetic acid for suppressing decomposition of nitric acid.

Figure 3C:
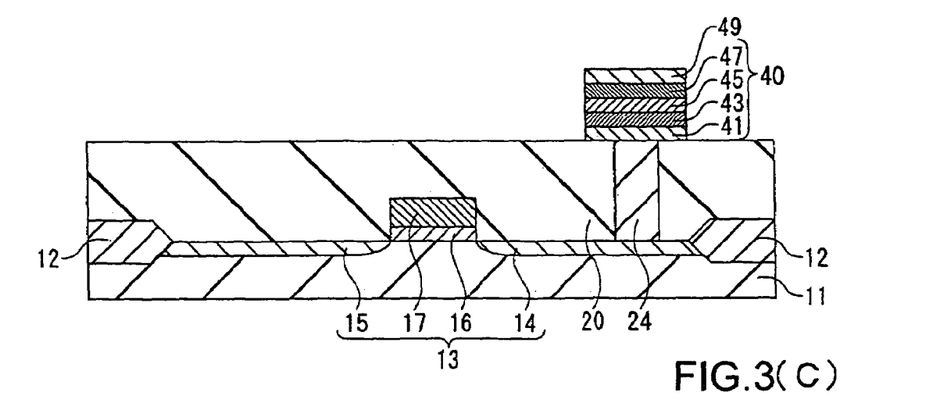

In the next step, the capacitor forming laminated layer 30 is etched through the RIE with the etching mask 49 to form a lamination 40 as a ferroelectric capacitor. It takes a very long time to etch the etching mask 49 formed of strontium tantalate through the RIE, so that the etching mask 49 withstands as a mask during the RIE. Accordingly, during the RIE, it is necessary only to replace a gas without reproducing the mask to form the ferroelectric capacitor. For example, the first and second conductive layers 33 and 37 are etched under a $Cl_2$—$O_2$ type gas, the ferroelectric layer 35 is etched under a $Cl_2$—Ar type gas, and the metal layer 31 is etched under a $BCl_3$—$Cl_2$ type gas.

A remaining portion of the metal layer 31 after the etching becomes a barrier metal 41, and a remaining portion of the first conductive layer 33 after the etching becomes a lower electrode 43. A remaining portion of the ferroelectric layer 35 after the etching becomes a ferroelectric layer 45, and a remaining portion of the second conductive layer 37 after the etching becomes an upper electrode 47. The barrier metal 41 is provided for preventing a reaction between a plug material of the conductive plug 24 and an electrode material of the lower electrode 43. In the embodiment, the silicon oxide layer mask 52 used in the wet etching is removed during the RIE. After the lamination (ferroelectric capacitor) 40 is formed through the RIE, the etching mask 49 remains and has a thickness of 25 nm (see FIG. 3(C)).

An etching rate of strontium tantalate relative to the lower and upper electrodes 42 and 47 during the dry etching is called selectivity, and it is possible to make the selectivity more than 4. Further, it is possible to make the dry etching selectivity of strontium tantalate relative to the ferroelectric layer 45 more than 3.

As described above, it is difficult to etch a material such as strontium tantalate through the dry etching, and such a material is used as the etching mask for the dry etching to reduce a thickness of the etching mask. When the etching mask has a small thickness, a dimensional conversion difference decreases. Accordingly, it is possible to produce the ferroelectric capacitor with high accuracy, and produce a capacitor stack having a size of at lease 0.5 μm square.

With reference to FIGS. 4(A)–4(B) and 5(A)–5(B), a method of producing a ferroelectric capacitor according to a second embodiment of the present invention will be explained next. FIGS. 4(A)–4(B) and 5(A)–5(B) are explanatory sectional views showing the method of producing a ferroelectric capacitor according to the second embodiment of the present invention. A process up to the step in which the lamination 40 is formed through the RIE is the same as that of the first embodiment shown in FIGS. 1(A) to 3(B), and descriptions thereof are omitted.

Figure 4A:
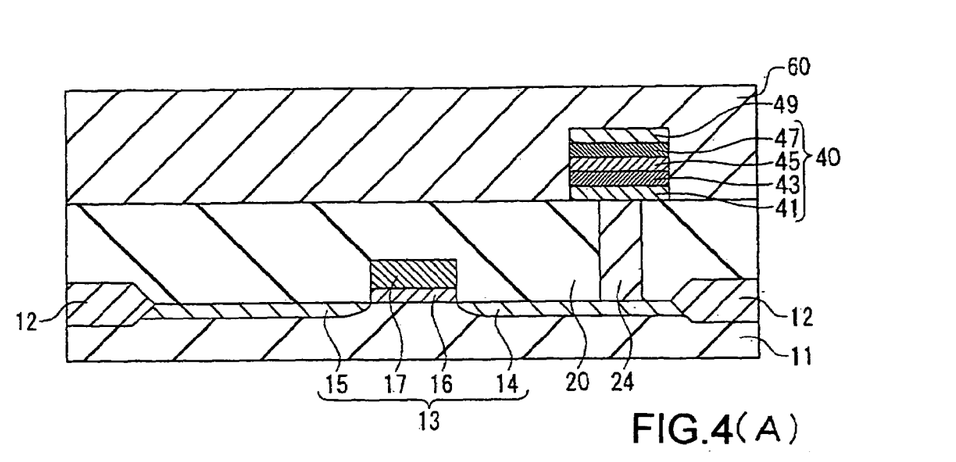
FIGS. 4(A) to 4(C) are explanatory views showing a method of producing a ferroelectric capacitor (No. 1) according to a second embodiment of the present invention.
Figure 4B:
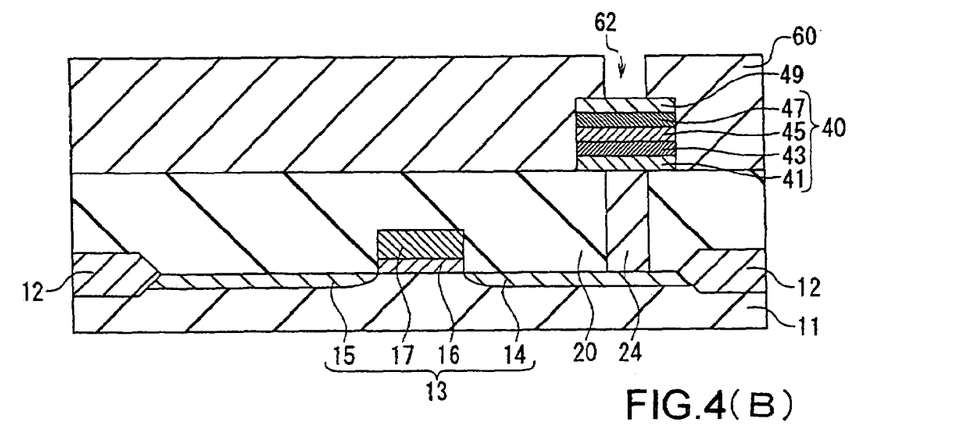

After the lamination or ferroelectric capacitor 40 is formed, the lamination 40 and the etching mask 49 are embedded in a second interlayer insulating layer 60 having a relatively large thickness without removing the etching mask 49 formed of strontium tantalate (see FIG. 4(A)). The second interlayer insulating layer 60 is formed of a silicon oxide layer with the CVD method. When the lamination 40 is formed through the RIE, if a part or whole of the etching mask 49 is removed, a new layer formed of strontium tantalate is formed as the etching mask 49.

In the next step, a resist formed of an organic resin is applied on the second interlayer insulating layer 60 to form a photo-resist layer (not shown). A pattern is formed with a known lithography, so that a photo-resist pattern (not shown) is formed to have an opening in a contact hole forming area of the second interlayer insulating layer 60. The second interlayer insulating layer 60 is etched through the dry etching with the photo-resist pattern as a mask to form a contact hole 62 in the second interlayer insulating layer 60 (see FIG. 4(B)). During the step, the etching mask 49 formed of strontium tantalate is hardly etched under the etching condition of the second interlayer insulating layer 60 formed of silicon oxide, and functions as an etching stop.

Figure 4C:
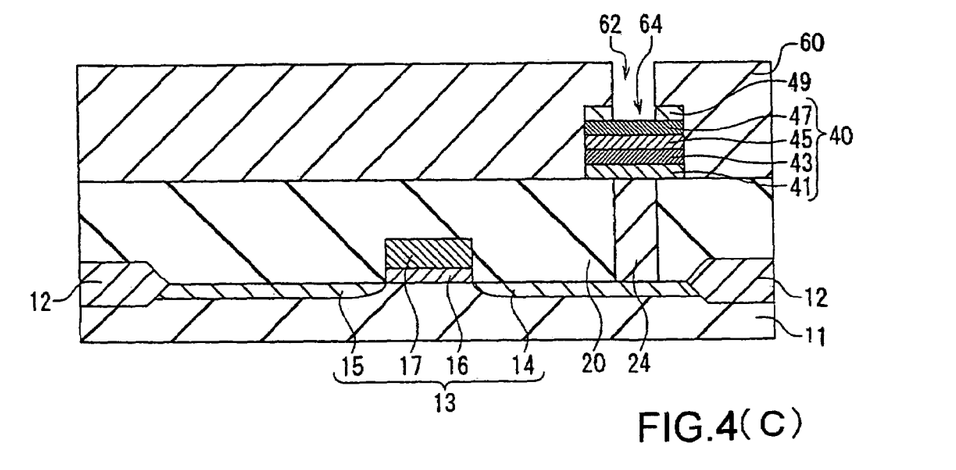

In the next step, the etching mask 49 is etched through the wet etching with the second interlayer insulating layer 60 having the contact hole 62 as a mask to form a contact hole 64 in the etching mask 49 (see FIG. 4(C)). Etching conditions of the step such as an etchant are the same as those of the wet etching in which the etching mask 49 is formed as shown in FIG. 3(B), and descriptions thereof are omitted.

Figure 5A:
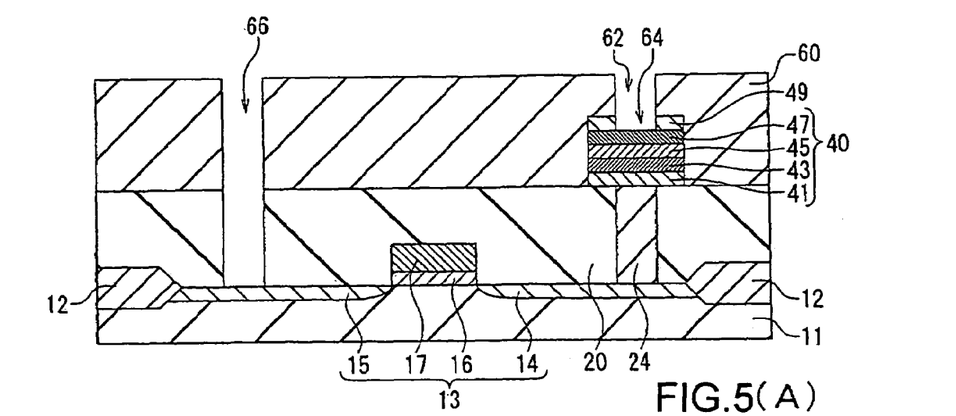
FIGS. 5(A) to 5(C) are explanatory views showing a method of producing a ferroelectric capacitor (No. 2) according to the second embodiment of the present invention.
Figure 5B:
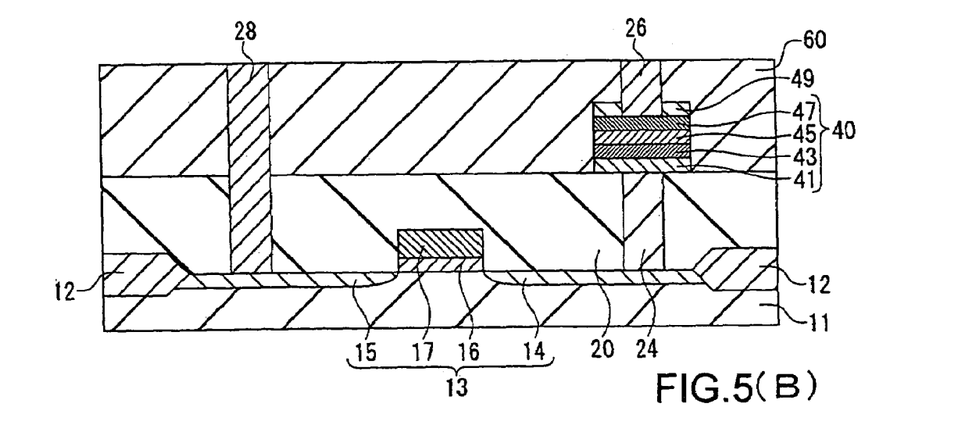
Figure 5C:
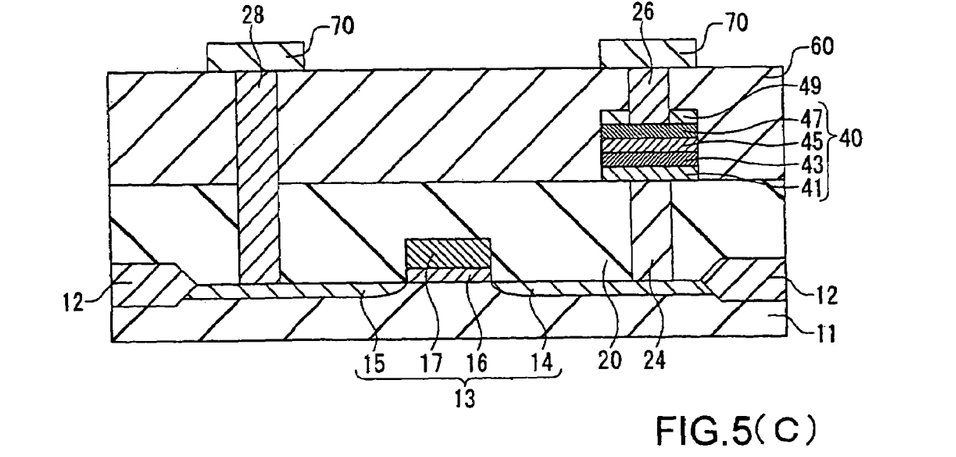

In the next step, a contact hole 66 is formed in the first interlayer insulating layer 20 and the second interlayer insulating layer 60 above the drain area 14 or the source area 15 (in the embodiment, above the source area 15; see FIG. 5(A)). The contact holes 62, 64, and 66 are filled with tungsten with the CVD method to form conductive plugs 26 and 28 (see FIG. 5(B)). Then, a metal (aluminum) wiring 70 is formed on the conductive plugs 26 and 28 formed in the second interlayer insulating layer 60 with the sputtering method (see FIG. 5(C)). The MOSFET 13 and the lamination (ferroelectric capacitor) 40 are electrically connected to an external device through the metal wiring 70.

In the second embodiment, the contact holes in the lamination 40 are formed sequentially through the dry etching and the wet etching. During the dry etching, the etching mask 49 functions as the etching stop. Accordingly, when the contact hole is formed through the dry etching, it is possible to reduce physical damage due to an electrical field stress such as charging or chemical damage due to a reducing gas passing through the upper electrode against the ferroelectric capacitor.

Figure 6A:
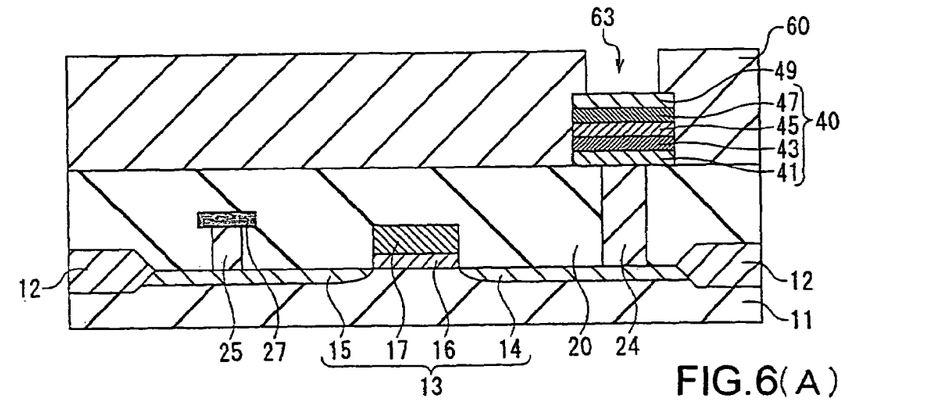
FIGS. 6(A) to 6(C) are explanatory views showing a method of producing a ferroelectric capacitor according to a third embodiment of the present invention.
Figure 6B:
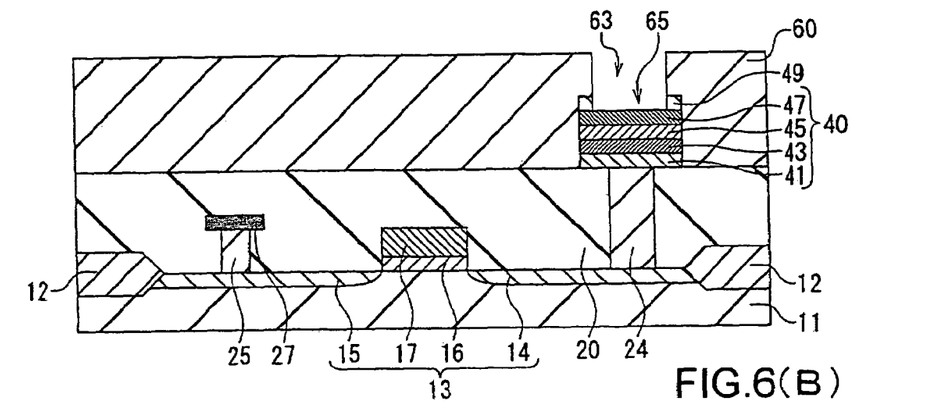
Figure 6C:
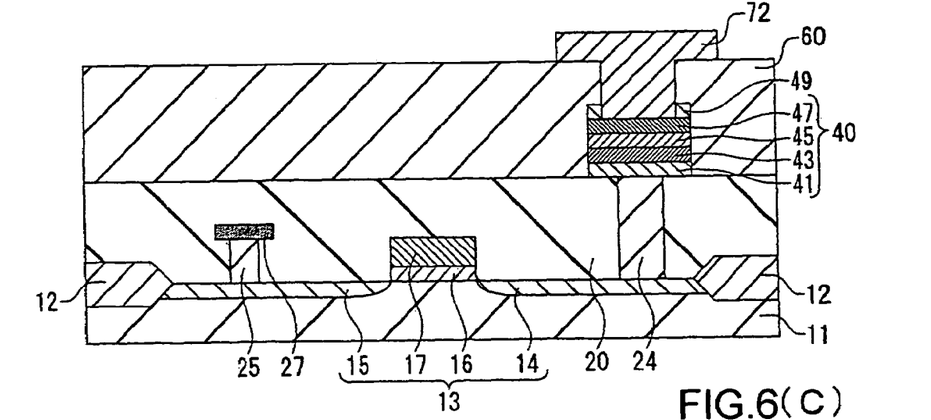

With reference to FIGS. 6(A) to 6(C), a method of producing a ferroelectric capacitor according to a third embodiment of the present invention will be explained next. FIGS. 6(A) to 6(C) are explanatory views showing the method of producing a ferroelectric capacitor according to the third embodiment of the present invention. Except that a conductive plug 25 and a bit wire 27 are provided in the first interlayer insulating layer 20, a process up to the step in which the lamination 40 and the etching mask 49 are embedded in the second interlayer insulating layer 60 is the same as that of the second embodiment shown in FIG. 4(A), and descriptions thereof are omitted.

After the second interlayer insulating layer 60 is formed, a resist formed of an organic resin is applied on the second interlayer insulating layer 60 to form a photo-resist layer (not shown). A pattern is formed with a known lithography, so that a photo-resist pattern (not shown) is formed to have an opening in a contact hole forming area of the second interlayer insulating layer 60. The second interlayer insulating layer 60 is etched through the dry etching with the photo-resist pattern as a mask to form a contact hole 63 in the second interlayer insulating layer 60 (see FIG. 6(A)). During the step, the etching mask 49 formed of strontium tantalate is hardly etched under the etching conditions of the second interlayer insulating layer 60 formed of silicon oxide, and functions as an etching stop.

In the next step, the etching mask 49 is etched through the wet etching with the second interlayer insulating layer 60 having the contact hole 63 as a mask to form a contact hole 65 in the etching mask 49 (see FIG. 6(B)). The contact holes 63 and 65 have an areal ratio relative to an area of the ferroelectric capacitor 40 larger than that in the second embodiment. For example, an opening of the contact hole is about 0.8 µm square relative to the capacitor having a size of 1.0 µm square, and has an area more than nine times larger than that in the second embodiment. Then, aluminum is formed in a film at a high temperature to form a metal wiring 72 filled in the contact holes 63 and 65 (see FIG. 6(C)).

In the third embodiment, it is possible to reduce an aspect ratio of the contact hole. Accordingly, it is not necessary to form the conductive plug filled with tungsten through the CVD method, thereby reducing deterioration of the ferroelectric capacitor due to reduction. That is, it is possible to eliminate the process causing the reduction deterioration after the lamination or ferroelectric capacitor 40 is formed, thereby making it possible to produce the ferroelectric capacitor with high reliability.

The disclosure of Japanese Patent Application No. 2004-220156, filed on Jul. 28, 2004, is incorporated in the application.

While the invention has been explained with reference to the specific embodiments of the invention, the explanation is illustrative and the invention is limited only by the appended claims:

What is claimed is:

1. A method of producing a ferroelectric capacitor, comprising:
   preparing a semiconductor substrate;
   forming a first insulating layer on the semiconductor substrate;
   laminating sequentially a metal layer, a first conductive layer, a ferroelectric layer, and a second conductive layer on the first insulating layer to form a capacitor forming laminated layer;
   forming an etching mask forming layer formed of strontium tantalate or strontium niobate on the capacitor forming laminated layer;
   forming a silicon oxide layer mask on the etching mask forming layer covering a ferroelectric capacitor forming area;
   forming an etching mask through first wet etching of the etching mask forming layer with the silicon oxide layer mask in a mixture of nitric acid, fluorinated acid, and acetic acid; and
   forming a lamination having a barrier metal, a lower electrode, a ferroelectric layer, and an upper electrode through dry etching of the capacitor forming laminated layer with the etching mask.

2. A method according to claim 1, further comprising, after the step of forming the lamination, leaving the etching mask forming layer formed of strontium tantalate or strontium niobate on the lamination as an etching stop layer, forming a second interlayer insulating layer on the first interlayer insulating layer and the etching stop layer, forming a contact hole in the second interlayer insulating layer above the etching stop layer, and forming an opening in the etching stop layer through second wet etching.

3. A semiconductor device according to claim 2, wherein, in the step of forming the opening in the etching stop layer, said second wet etching is performed in a mixture of nitric acid, fluorinated acid, and acetic acid.

4. A semiconductor device according to claim 2, wherein, in the step of forming the opening in the etching stop layer, said second wet etching is performed in a mixture of nitric acid and fluorinated acid.

5. A method according to claim 1, further comprising, after the step of forming the lamination, forming a second interlayer insulating layer on the first interlayer insulating layer and the etching mask, forming a contact hole in the second interlayer insulating layer above the etching stop layer with the etching mask as an etching stop layer, and forming an opening in the etching mask through third wet etching.

6. A semiconductor device according to claim 5, wherein, in the step of forming the opening in the etching mask, said third wet etching is performed in a mixture of nitric acid, fluorinated acid, and acetic acid.

7. A semiconductor device according to claim 5, wherein, in the step of forming the opening in the etching mask, said third wet etching is performed in a mixture of nitric acid and fluorinated acid.

8. A semiconductor device according to claim 1, wherein, in the step of forming the etching mask through the first wet etching, the mixture contains 2 to 95 weight % of 60% nitric acid aqueous solution, 5 to 98 weight % of 50% fluorinated acid aqueous solution, and 5 to 70 weight % of glacial acetic acid.

9. A method of producing a ferroelectric capacitor, comprising:
   preparing a semiconductor substrate;
   forming a first insulating layer on the semiconductor substrate;
   laminating sequentially a metal layer, a first conductive layer, a ferroelectric layer, and a second conductive layer on the first insulating layer to form a capacitor forming laminated layer;
   forming an etching mask forming layer formed of strontium tantalate or strontium niobate on the capacitor forming laminated layer;
   forming a silicon oxide layer mask on the etching mask forming layer covering a ferroelectric capacitor forming area;
   forming an etching mask through first wet etching of the etching mask forming layer with the silicon oxide layer mask in a mixture of nitric acid and fluorinated acid; and
   forming a lamination having a barrier metal, a lower electrode, a ferroelectric layer, and an upper electrode through dry etching of the capacitor forming laminated layer with the etching mask.

10. A method according to claim 9, further comprising, after the step of forming the lamination, leaving the etching mask forming layer formed of strontium tantalate or strontium niobate on the lamination as an etching stop layer, forming a second interlayer insulating layer on the first interlayer insulating layer and the etching stop layer, forming a contact hole in the second interlayer insulating layer above the etching stop layer, and forming an opening in the etching stop layer through second wet etching.

11. A method according to claim 9, further comprising, after the step of forming the lamination, forming a second interlayer insulating layer on the first interlayer insulating layer and the etching mask, forming a contact hole in the second interlayer insulating layer above the etching stop layer with the etching mask as an etching stop layer, and forming an opening in the etching mask through third wet etching.

12. A semiconductor device according to claim 9, wherein, in the step of forming the etching mask through the first wet etching, the mixture contains 2 to 95 weight % of 60% nitric acid aqueous solution, and 5 to 98 weight % of 50% fluorinated acid aqueous solution.

* * * * *

UNITED STATES PATENT AND TRADEMARK OFFICE
CERTIFICATE OF CORRECTION

PATENT NO. : 7,157,288 B2 Page 1 of 1
APPLICATION NO. : 11/105439
DATED : January 2, 2007
INVENTOR(S) : Toshio Ito It is certified that error appears in the above-identified patent and that said Letters Patent is hereby corrected as shown below:

On Title Page, Item (30)
In Foreign Application Priority Date, please change "Aug. 24, 2004 (JP) .... 2004-243520" to --Jul. 28, 2004 (JP) .... 2004-220156--.

Signed and Sealed this

First Day of May, 2007

JON W. DUDAS
*Director of the United States Patent and Trademark Office*